(12) United States Patent
Hoentschel et al.

(10) Patent No.: US 8,440,530 B2
(45) Date of Patent: May 14, 2013

(54) METHODS OF FORMING HIGHLY SCALED SEMICONDUCTOR DEVICES USING A DISPOSABLE SPACER TECHNIQUE

(75) Inventors: Jan Hoentschel, Dresden (DE); Stefan Flachowsky, Dresden (DE); Shiang Yang Ong, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/275,766

(22) Filed: Oct. 18, 2011

(65) Prior Publication Data

US 2013/0095620 A1    Apr. 18, 2013

(51) Int. Cl.
   *H01L 21/00*    (2006.01)
(52) U.S. Cl.
   USPC ..... 438/275; 438/199; 438/306; 257/E21.633
(58) Field of Classification Search ........... 438/199, 438/275–276, 301–303, 305–307; 257/E21.633
   See application file for complete search history.

(56) References Cited

U.S. PATENT DOCUMENTS

| | | | |
|---|---|---|---|
| 2005/0190421 A1* | 9/2005 | Chen et al. | 359/211 |
| 2007/0202653 A1* | 8/2007 | Hoentschel et al. | 438/301 |
| 2009/0294866 A1* | 12/2009 | Eller et al. | 257/369 |

* cited by examiner

*Primary Examiner* — Thanhha Pham
(74) *Attorney, Agent, or Firm* — Williams, Morgan & Amerson, P.C.

(57) ABSTRACT

In one example, a method disclosed herein includes the steps of forming a first liner layer above a substrate and above gate structures for both a PMOS transistor and an NMOS transistor, and, after forming extension implant regions and halo implant regions, forming a first spacer proximate the gate structures of both the PMOS and NMOS transistors, forming deep source/drain implant regions in the substrate for the PMOS and NMOS transistors, removing the first spacer and, after removing the first spacer, forming a layer of material between the adjacent gate structures, wherein the layer of material occupies at least the space formerly occupied by the first spacer.

19 Claims, 4 Drawing Sheets

METHODS OF FORMING HIGHLY SCALED SEMICONDUCTOR DEVICES USING A DISPOSABLE SPACER TECHNIQUE

BACKGROUND OF THE INVENTION

1. Field of the Invention

Generally, the present disclosure relates to the manufacturing of sophisticated semiconductor devices, and, more specifically, to various methods of forming highly scaled semiconductor devices using a disposable spacer technique.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped regions source/drain regions.

In a field effect transistor, the conductivity of the channel region, i.e., the drive current capability of the conductive channel is controlled by a gate electrode formed adjacent to the channel region and separated therefrom by a thin gate insulation layer. The conductivity of the channel region, upon formation of a conductive channel due to the application of an appropriate control voltage to the gate electrode, depends upon, among other things, the dopant concentration, the mobility of the charge carriers and, for a given extension of the channel region in the transistor width direction, the distance between the source and drain regions, which is also referred to as the channel length of the transistor. Hence, in combination with the capability of rapidly creating a conductive channel below the insulating layer upon application of the control voltage to the gate electrode, the conductivity of the channel region substantially affects the performance of MOS transistors. Thus, since the speed of creating the channel, which depends in part on the conductivity of the gate electrode, and the channel resistivity substantially determine the characteristics of the transistor, the scaling of the channel length, and associated therewith the reduction of channel resistivity, are dominant design efforts used to increase the operating speed of the integrated circuits.

The formation of transistors typically involves performing one or more ion implantation processes to form various doped regions in the substrate, such as halo implant regions, extension implant regions and deep source/drain implant regions. In many of the cases, one or more spacers are formed adjacent a gate electrode structure so as to control the location of the various implant regions. Typically, these spacers are made of silicon nitride to facilitate processing. More specifically, silicon nitride is often selected because it can be readily etched, and thus removed, relative to a silicon substrate and an underlying silicon dioxide liner layer which is frequently present to act as an etch stop layer when the silicon nitride spacer is removed. Although the use of multiple spacers in forming the various implant regions provides a mechanism whereby the location of various doped regions may be positioned so as to individually enhance the performance capabilities of the PMOS transistors and the NMOS transistors, the formation of so such spacers does have a downside. More specifically, during the formation of the various spacers, the exposed substrate, i.e., the areas of the substrate where the source/drain regions are to be formed, are also attacked which leads to undesirable localized recessing of the substrate in those areas. In some application, such recessing may remove about 20-40 nm of the substrate 10. Such recessing may, in effect, consume some of the implanted dopant materials in the substrate 10. Such recessing may result in increased parasitic resistance which may reduce the drive current of the transistors. Such recessing may also effectively increase the distance current must travel through the transistor, which may tend to reduce the operating speed of the transistors.

Another problem arises because the space between adjacent gate electrode structures, or more precisely, between the sidewall spacers formed on adjacent gate electrode structures is very small. For example, the current-day transistors may have a gate length of about 25-30 nm, and such transistors may be formed with a gate pitch that ranges from about 160-190 nm, depending upon the particular application. Thus, the distance between adjacent gate structures may be about 130-160 nm. The lateral space between adjacent gate structures is also typically occupied by a conformal liner layer and one or more spacers that are used in the various implantation processes described above. Thus, the lateral space between adjacent spacers will be even smaller.

Device designers are under constant pressure to increase the operating speed and electrical performance of transistors and integrated circuit products that employ such transistors. Given that the gate length (the distance between the source and drain regions) on modern transistor devices may be approximately 30-50 nm, and that further scaling is anticipated in the future, device designers have employed a variety of techniques in an effort to improve device performance, e.g., the use of high-k dielectrics, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors). Stress engineering techniques typically involve the formation of specifically made silicon nitride layers that are selectively formed above appropriate transistors, i.e., a layer of silicon nitride that is intended to impart a tensile stress in the channel region of a NMOS transistor would only be formed above the NMOS transistors. Such selective formation may be accomplished by masking the PMOS transistors and then blanket depositing the layer of silicon nitride, or by initially blanket depositing the layer of silicon nitride across the entire substrate and then performing an etching process to selectively remove the silicon nitride from above the PMOS transistors. Conversely, for PMOS transistors, a layer of silicon nitride that is intended to impart a compressive stress in the channel region of a PMOS transistor is formed above the PMOS transistors. The techniques employed in forming such nitride layers with the desired tensile or compressive stress are well known to those skilled in the art.

However, as noted above, the lateral dimension between adjacent spacers is so small that it makes the formation of such stress-inducing layers very difficult. More specifically, in forming such stress-inducing material layers, even if a highly conformal deposition process is used to form these layers, the stress-inducing layers do not completely fill the lateral space between the adjacent spacers. This may result in the formation of undesirable voids in such layers. In a later process step whereby conductive contacts are formed to the substrate, these voids may become wholly or partially filled with conductive material, which constitute defects that can lead to potential short circuit problems. As an example, such defects may provide a short circuit between adjacent conductive contacts and/or adjacent gate structures. Such defects may cause a decrease in the electrical performance capability of the device or, in a worst-case scenario, complete device failure. In some cases, the filled voids may be referred to as so-called tungsten subways.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming highly scaled semiconductor devices using a disposable spacer technique. In one example, a method disclosed herein includes the steps of forming gate structures for a PMOS transistor and for an NMOS transistor above a semiconducting substrate, the gates structures being adjacent to one another, forming a first liner layer above the substrate and above the gate structures for both the PMOS transistor and the NMOS transistor, and, after forming the first liner layer, performing a plurality of extension ion implant processes through the first liner layer to form extension implant regions in the substrate for the PMOS transistor and the NMOS transistor, and performing a plurality of halo ion implant processes through the first liner layer to form halo implant regions in the substrate for the PMOS transistor and the NMOS transistor. The method further includes the steps of, after forming the extension implant regions and the halo implant regions, forming a first spacer proximate the gate structures of both the PMOS transistor and the NMOS transistor, performing a plurality of source/drain ion implant processes with the first spacer in place to form deep source/drain implant regions in the substrate for the PMOS transistor and the NMOS transistor, removing the first spacer and after removing the first spacer, forming a layer of material between the adjacent gate structures, wherein the layer of material occupies at least the space formerly occupied by the first spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
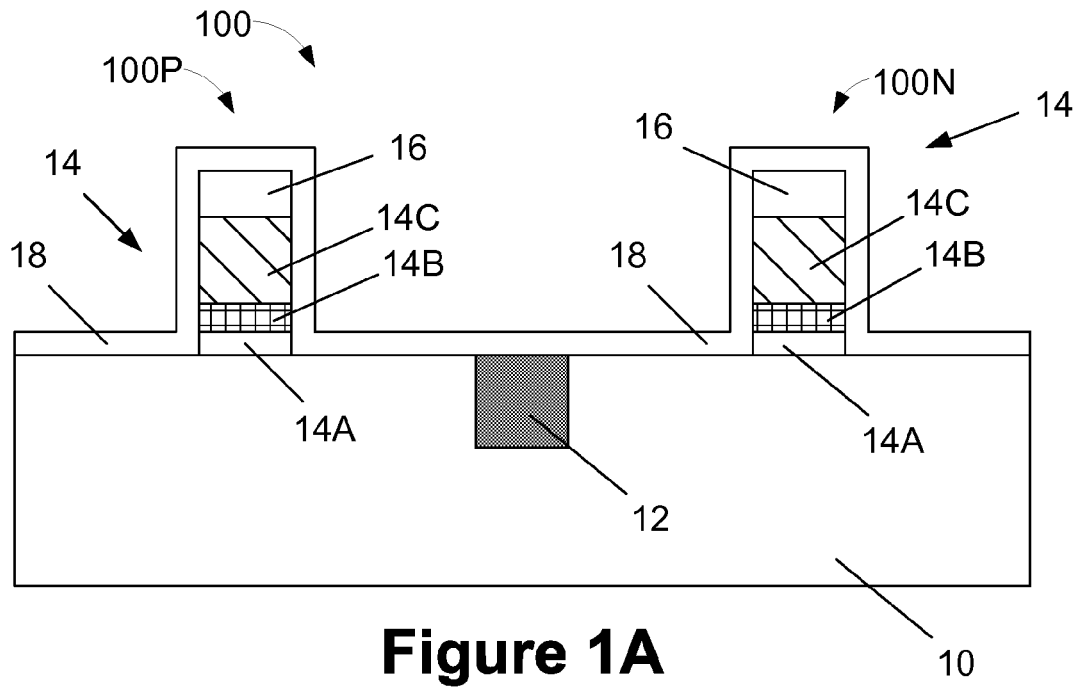
FIGS. 1A-1H depict various illustrative examples of using the methods disclosed herein to form forming highly scaled semiconductor devices using a disposable spacer technique.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming highly scaled semiconductor devices using a disposable spacer technique. Such a novel process flow may tend to reduce the undesirable recessing of the substrate, and it may provide more room for the formation of stress inducing layers of material. Moreover, such a novel process flow may tend to at least reduce some of the problems associated with the illustrative prior art process flow described previously. As will be readily apparent to those skilled in the art upon a complete reading of the present application, the present method is applicable to a variety of technologies, e.g., MOS-based technologies, etc., and is readily applicable to a variety of devices, including, but not limited to, logic devices, memory devices, etc. With reference to FIGS. 1A-1H, various illustrative embodiments of the methods and devices disclosed herein will now be described in more detail.

FIGS. 1A-1H depict one illustrative embodiment of various novel process flows disclosed herein for forming a semiconductor device 100 that includes an illustrative PMOS transistor 100P and an illustrative NMOS transistor 100N. As shown in FIG. 1A, the process begins with the formation of illustrative gate electrode structures 14 for the PMOS transistor 100P and the NMOS transistor 100N in and above regions of the substrate 10 that are separated by an illustrative shallow trench isolation structure 12. In the depicted examples, the gate electrode structures 14 generally include a gate insulation layer 14A, a metal layer 14B and a layer 14C of polysilicon or amorphous silicon. A gate cap layer 16, having a thickness that may range from about 10-30 nm and made of a material such as silicon dioxide, is formed above the gate structures 14. Also depicted in FIG. 1A is an illustrative liner layer 18, made of a material such as silicon dioxide having a thickness of approximately 2-5 nm, that is conformally deposited on the device 100. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

The gate electrode structures 14 depicted herein are intended to be schematic and representative in nature, as the materials of construction used in the gate structures 14 may be different for the PMOS transistor 100P as compared to the NMOS transistor 100N, e.g., the PMOS transistor 100P may have multiple layers of conductive metal, etc. The gate insulation layer 14A may be comprised of a variety of materials, such as silicon dioxide, silicon oxynitride, a high-k (k value greater than 10) insulating material. The metal layer 14B may be comprised of a variety of materials such as, for example, titanium, titanium nitride, etc. As noted previously, the layer 14C may be comprised of, polysilicon, amorphous silicon, etc. As will be recognized by those skilled in the art after a complete reading of the present application, the gate structures 14 may be of any desired construction and comprised of any of a variety of different materials, such as one or more conductive layers made of polysilicon or a metal, etc., and one or more layers of insulating material, such as silicon dioxide, a high-k material, etc. Thus, the particular details of construction of gate structure 14, and the manner in which the gate structures 14 are formed, should not be considered a limitation of the present invention. For example, the gate structures 14 may be made using so-called "gate-first" or "gate-last" techniques.

The structure depicted in FIG. 1A may be formed by a performing a variety of known techniques. For example, using one illustrative technique, the layers of material that make up the gate insulation layer 14A, the metal layer 14B, the layer 14C and the gate cap layer 16 may be blanket-deposited above the substrate 10 and, thereafter, one or more etching process are performed through a patterned mask layer (not shown) to define the basic structures depicted in FIG. 1A. Thereafter, the liner layer 18 is formed by performing a low temperature (about 200° C.) conformal deposition process, such as a plasma enhanced chemical vapor deposition process or an atomic layer deposition process.

Figure 1B:
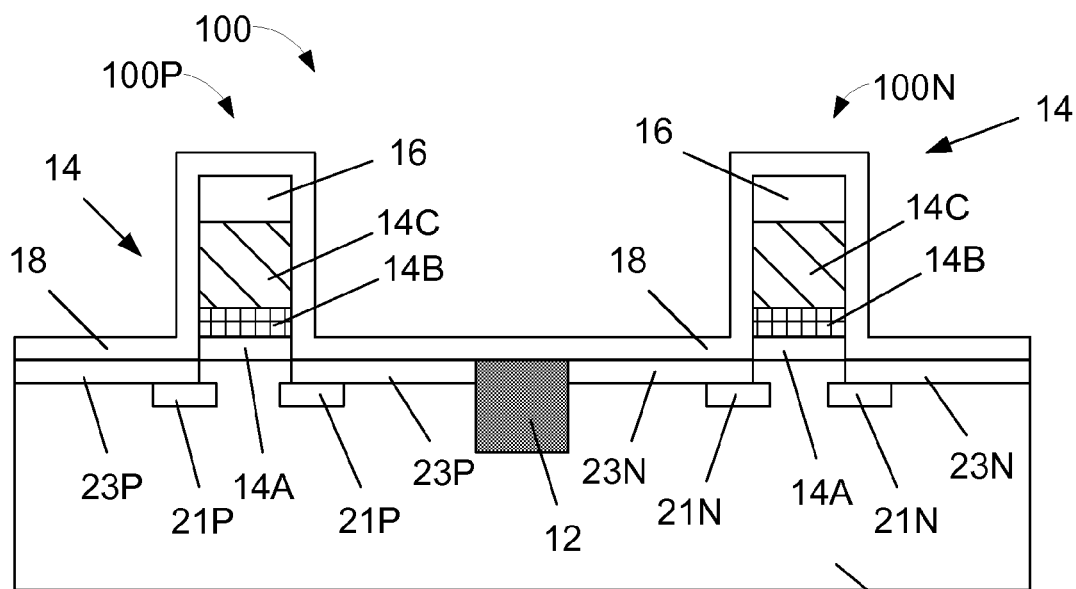

FIG. 1B depicts the device 100 after various implantation processes have been performed, using appropriate masking layers, to form halo implant regions and extension implant regions in both the PMOS transistor 100P and the NMOS transistor 100N. In one illustrative embodiment, the various ion implant processes are performed through the liner layer 18. The implant regions may be formed in any order, i.e., the implant regions may be formed first on either of the PMOS transistor 100P or the NMOS transistor 100N. The extension implant regions and the halo implant regions may likewise be formed in any order. In one illustrative process flow, a masking layer (not shown), e.g., such a photoresist mask, is formed so as to cover the NMOS transistor 100N and expose the PMOS transistor 100P such that various doped regions for the PMOS transistor 100P may be formed in the substrate 10. More specifically, at the point depicted in FIG. 1B, an angled halo ion implant process has been performed using an N-type dopant material to form the schematically depicted N-doped halo implant regions 21P for the PMOS transistor 100P, and a vertical extension ion implant process has been performed using a P-type dopant material to form P-doped extension implant regions 23P for the PMOS transistor 100P.

Next, the masking layer above the NMOS transistor 100N is removed and a masking layer (not shown), e.g., such a photoresist mask, is formed so as to cover the PMOS transistor 100P and expose the NMOS transistor 100N such that various doped regions for the NMOS transistor 100N may be formed in the substrate 10. More specifically, at the point depicted in FIG. 1B, an angled halo ion implant process has been performed using a P-type dopant material to form the schematically depicted P-doped halo implant regions 21N for the NMOS transistor 100N, and another vertical extension ion implant process has been performed using an N-type dopant material to form N-doped extension implant regions 23N for the NMOS transistor 100N.

Thereafter, in one illustrative embodiment, a very quick anneal process, such as a laser anneal process, may be performed at a temperature of about 1250° C. for about 10 milliseconds or so to repair the damaged lattice structure of the substrate 10 in the areas that were subjected to the ion implant processes discussed above. The implant regions 21P, 23P, 21N, 23N are depicted schematically and they are located in a position where they will be after the anneal process has been performed where some migration of the implanted dopant material may have occurred.

Figure 1C:
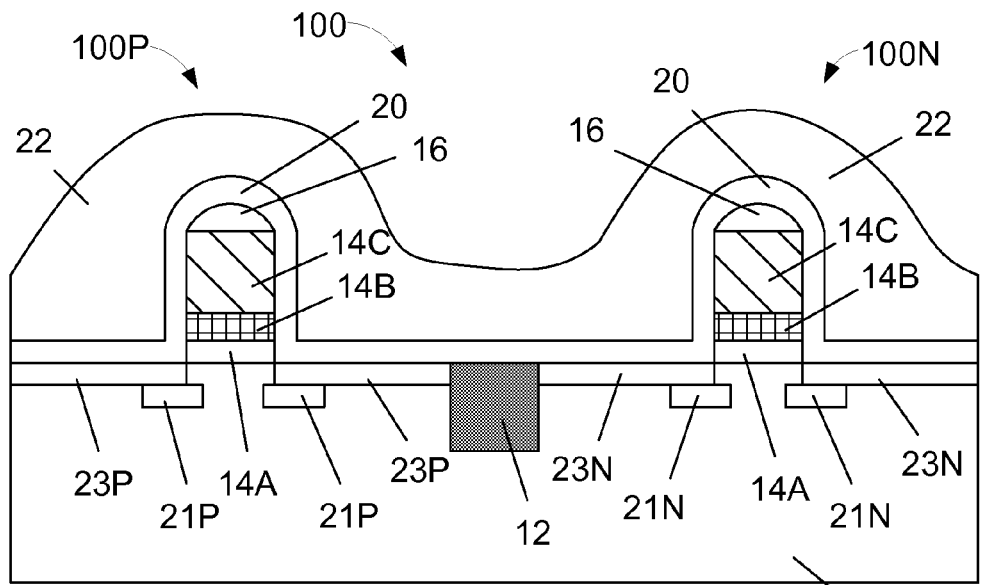

FIG. 1C also depicts the device 100 after several process operations have been performed on the device 100. A wet or dry etching process has been performed to remove the liner layer 18. In one embodiment, a wet etching process using, for example, a dilute HF acid, is performed to remove the liner layer 18. In the illustrative example where the gate cap 16 is comprised of the same material as the liner layer 18, e.g., silicon dioxide, the gate cap layer 16 will also be attacked during the etching process that is performed to remove the liner layer 18. Thus, a slight rounding of the gate cap layer 16 is schematically depicted in FIG. 1C. In this example, since the liner layer 18 is made of silicon dioxide, it may be removed with an etching process that does not substantially attack the underlying substrate 10, thereby tending to avoid undesirable recessing of the substrate 10 as described in the background section of this application.

Continuing with FIG. 1C, an encapsulating layer 20, made of a material such as silicon nitride, is then conformally deposited above the NMOS transistor 100N and the PMOS transistor 100P. In some embodiments, the encapsulating layer 20 may have a thickness of about 4-6 nm, and it may be formed by performing a CVD process. As described more fully below, portions of this encapsulating layer will eventually act as an L-shaped spacer that is used in the silicidation process.

Still continuing with FIG. 1C, a layer of insulating material 22 is then deposited above the NMOS transistor 100N and the PMOS transistor 100P. The layer of insulating material 22 may be comprised of a variety of materials such as, for example, silicon dioxide, a low-k material (k value less than 3), etc. In some embodiments, the layer of insulating material 22 may have a thickness of about 40-60 nm, and it may be formed by performing a CVD process.

Figure 1D:
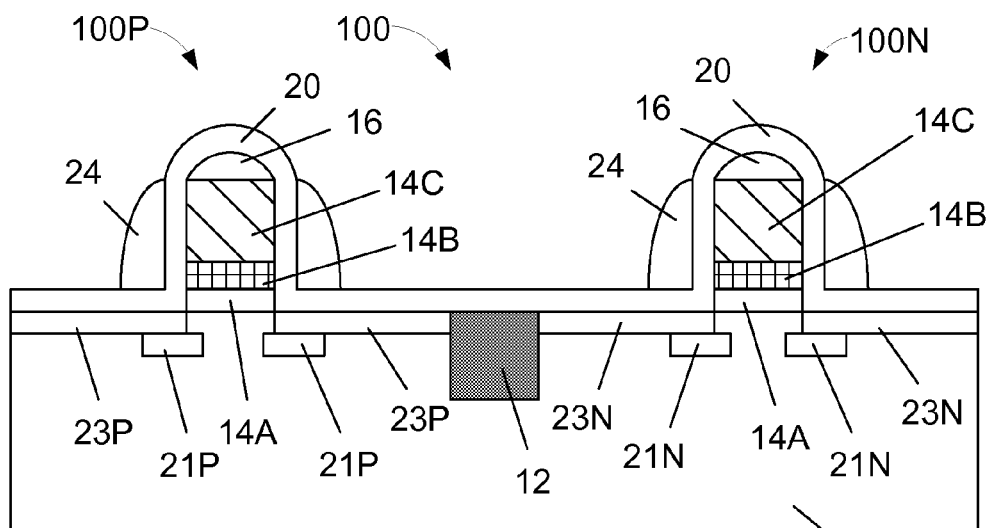

Next, As shown in FIG. 1D, illustrative spacers 24, with an illustrative base width of about 8-15 nm, are formed proximate the gate structures 14 for both the PMOS transistor 100P and the NMOS transistor 100N. The spacers 24 may be formed performing an anisotropic etching process on the layer of insulating material 22. During this anisotropic etching process, the encapsulating layer 20 protects the gate structures 14 and the substrate 10.

Figure 1E:
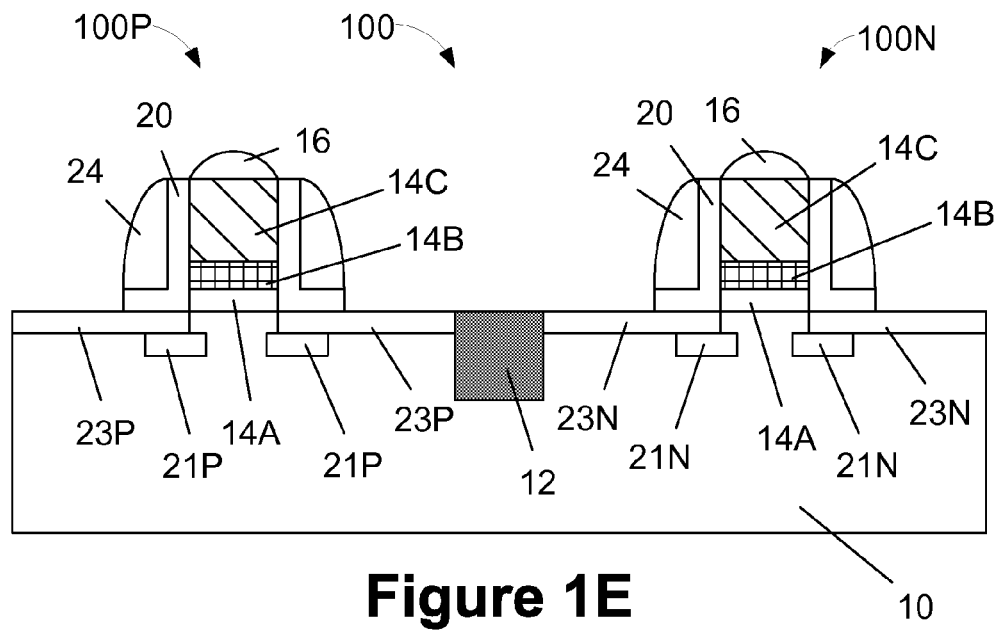

Next, as shown in FIG. 1E, an etching process is performed to remove the exposed portions of the encapsulating layer 20. The etching process may be either a wet or dry etching process. A masking layer (not shown), e.g., such a photoresist mask, is formed so as to cover the PMOS transistor 100P and expose the NMOS transistor 100N for further processing.

Figure 1F:
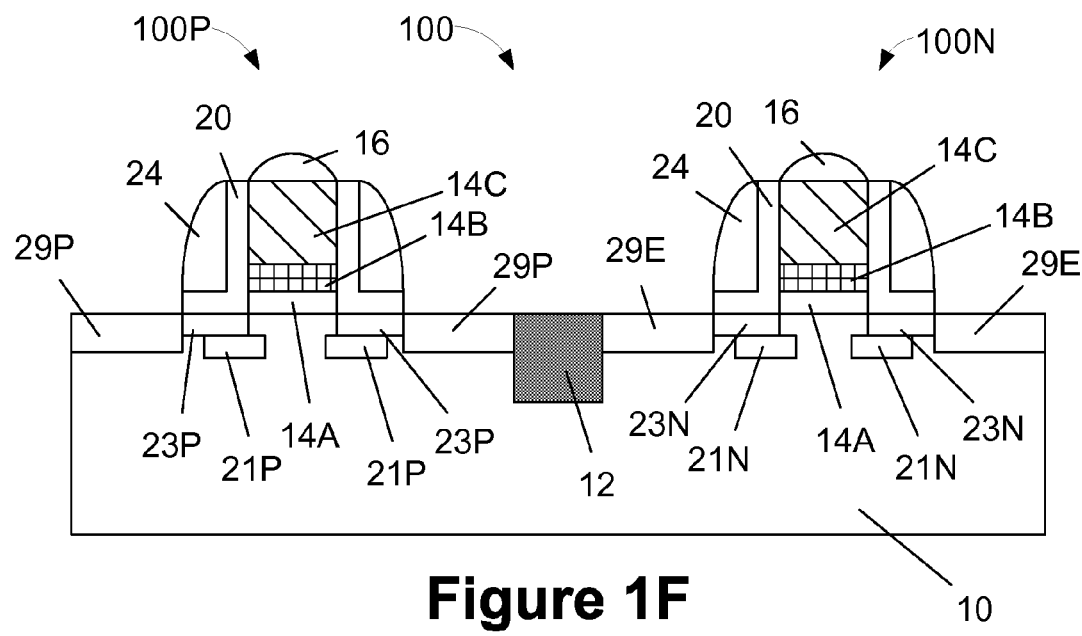

Thereafter, as shown in FIG. 1F, deep source/drain ion implant processes are performed on the PMOS transistor 100P and the NMOS transistor 100N using appropriate masking layers and appropriate dopant materials, all of which are well known to those skilled in the art, to form P-doped source/drain implant regions 29P on the PMOS transistor 100P and N-doped source/drain implant regions 29N on the NMOS transistor 100N. One or more anneal processes (e.g., a rapid thermal anneal at about 1050° C. for about 2 seconds followed by a flash anneal at about 1250° C. for a duration of about 1 ms) are then performed to repair lattice damage to the substrate 10 and to activate the implanted dopant materials.

Figure 1G:
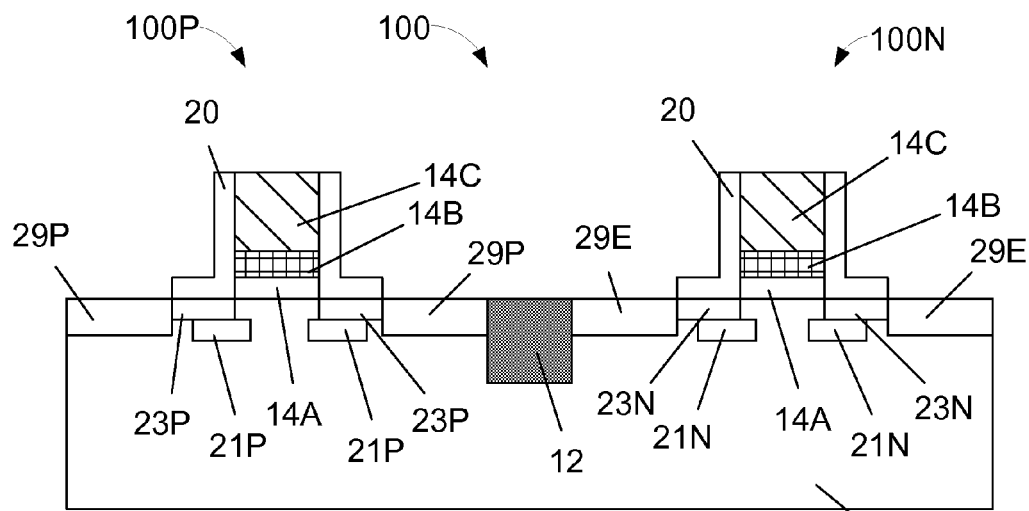

Next, as shown in FIG. 1G, an etching process, such as a dilute HF etching process is performed to remove the disposable spacer 24. This process also exposes the layer 14C (made of, for example, polysilicon or amorphous silicon) for further processing. By removing the disposable spacer 24, the lateral space between the adjacent gate structures (and the L-shaped spacer 20 if present) is greatly increased relative to the lateral spacing that was present between adjacent permanent spacers employed using the illustrative prior art technique describe above in the background section of this application. This larger lateral space makes it easier and more likely to form substantially void-free layers of material in this lateral region thereby tending to avoid or at least reduce some of the problems described in the background section of this application. As a specific example, one or more stress-inducing material layers (not shown) may be formed in this relatively larger lateral space. Additionally, this increase lateral space makes the formation of conductive contacts to the source/drain regions easier relative to the prior art techniques discussed previously.

Figure 1H:
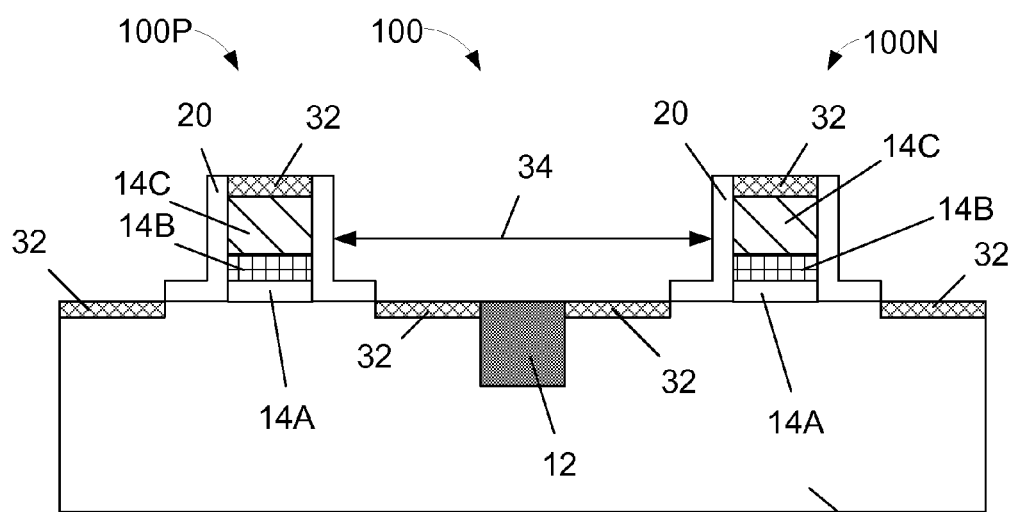

FIG. 1H depicts the device 100 after metal silicide regions 32 have been formed on the device 100. More specifically, the metal silicide regions 32 are formed on the gate electrode 14B and on the source/drain regions of the transistors 100P, 100N. So as not to obscure the drawings, the various doped regions described previously are not depicted in FIG. 1G. The metal silicide regions 32 may be made of any metal silicide and they may be formed using traditional silicidation techniques. The metal silicide regions 32 need not be the same metal silicide material on both the PMOS transistor 100P and the NMOS transistor 100N, although that may be the case. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. The details of such silicidation processes are well known to those skilled in the art.

Although not depicted in the drawings, the fabrication of the device 100 would include several additional steps such as the formation of a plurality of conductive contacts or plugs in a layer of insulating material so as to establish electrical connection with the source/drain regions of the transistors.

It should be noted that, when it is stated in this detailed description or in the claims, that certain spacers or combinations of spacers are positioned "proximate" to a structure or component, such as a gate structure, such language will be understood to cover situations where such a spacer or combinations of spacers actually contacts the structure or component, as well as a situation where there are one or more intervening layers of material between the spacer and the structure or component. For example, in some cases, there may be a liner layer or other spacers positioned between the referenced spacer and referenced structure, such as the illustrative gate structures 14 depicted herein. Additionally, the fact that the claims may make shorthand reference to a "first" spacer or a "first" type of process, such language does not mean that such a spacer or process was literally the first such spacer or process that was made or performed on the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   forming gate structures for a PMOS transistor and for an NMOS transistor above a semiconducting substrate, said gates structures being adjacent to one another;
   forming a continuous first liner layer that extends continuously above said substrate and above said gate structures for both said PMOS transistor and said NMOS transistor;
   after forming said continuous first liner layer:
      performing a plurality of extension ion implant processes through said continuous first liner layer to form extension implant regions in said substrate for said PMOS transistor and said NMOS transistor; and
      performing a plurality of halo ion implant processes through said continuous first liner layer to form halo implant regions in said substrate for said PMOS transistor and said NMOS transistor;
   after forming said extension implant regions and said halo implant regions, performing an etching process to remove said continuous first liner layer;
   after removing said first liner layer, forming a second liner layer on said gate structures of said PMOS transistor and said NMOS transistor;
   after forming said second liner layer, forming a first spacer adjacent to said second liner layer and proximate said gate structures of both said PMOS transistor and said NMOS transistor;
   performing a plurality of source/drain ion implant processes with said first spacer in place to form deep source/drain implant regions in said substrate for said PMOS transistor and said NMOS transistor;
   removing said first spacer; and
   after removing said first spacer, forming a layer of material between said adjacent gate structures, wherein said layer of material occupies at least the space formerly occupied by said first spacer.

2. The method of claim 1, further comprising performing at least one heating process to activate dopants implanted during said extension ion implant processes, dopants implanted during said halo ion implant processes and dopants implanted during said source/drain ion implant processes.

3. The method of claim 1, wherein said continuous first liner layer and said first spacer are comprised of silicon dioxide and said second liner layer is comprise of silicon nitride.

4. The method of claim 1, wherein forming said layer of material between said adjacent gate structures comprises forming a stress inducing layer of material.

5. The method of claim 1, wherein for each of said PMOS transistor and said NMOS transistor, said halo ion implant process is performed prior to performing said extension ion implant process.

6. The method of claim 1, wherein for each of said PMOS transistor and said NMOS transistor, said halo ion implant process is performed after performing said extension ion implant process.

7. A method, comprising:
forming gate structures for a PMOS transistor and for an NMOS transistor above a semiconducting substrate, said gates structures being adjacent to one another;
forming a first liner layer above said substrate and above said gate structures for both said PMOS transistor and said NMOS transistor;
after forming said first liner layer:
performing a plurality of extension ion implant processes through said first liner layer to form extension implant regions in said substrate for said PMOS transistor and said NMOS transistor; and
performing a plurality of halo ion implant processes through said first liner layer to form halo implant regions in said substrate for said PMOS transistor and said NMOS transistor;
after forming said extension implant regions and said halo implant regions, removing said first liner layer;
forming a second liner layer above said substrate and above said gate structures for both said PMOS transistor and said NMOS transistor;
forming a first spacer on said second liner layer proximate said gate structures of both said PMOS transistor and said NMOS transistor;
performing a plurality of source/drain ion implant processes with said first spacer in place to form deep source/drain implant regions in said substrate for said PMOS transistor and said NMOS transistor;
removing first spacer leaving said second liner layer in place; and
after removing said first spacer, forming a layer of material between said adjacent gate structures, wherein said layer of material occupies at least the space formerly occupied by said first spacer.

8. The method of claim 7, further comprising performing at least one heating process to activate dopants implanted during said extension ion implant processes, dopants implanted during said halo ion implant processes and dopants implanted during said source/drain ion implant processes.

9. The method of claim 7, wherein said first liner layer and said first spacer are comprised of silicon dioxide and said second liner layer is comprise of silicon nitride.

10. The method of claim 7, wherein forming said layer of material between said adjacent gate structures comprises forming a stress inducing layer of material.

11. The method of claim 7, wherein for each of said PMOS transistor and said NMOS transistor, said halo ion implant process is performed prior to performing said extension ion implant process.

12. The method of claim 7, wherein for each of said PMOS transistor and said NMOS transistor, said halo ion implant process is performed after performing said extension ion implant process.

13. The method of claim 7, wherein said first liner layer is a continuous first liner layer that extends continuously above said substrate and above said gate structures for both said PMOS transistor and said NMOS transistor, and wherein said pluralities of said extension and halo ion implant processes are performed through said continuous first liner layer.

14. A method, comprising:
forming gate structures for a PMOS transistor and for an NMOS transistor above a semiconducting substrate, said gates structures being adjacent to one another;
forming a continuous liner layer that extends continuously above said substrate and above said gate structures for both said PMOS transistor and said NMOS transistor;
after forming said continuous liner layer:
performing a plurality of extension ion implant processes to form extension implant regions in said substrate for said PMOS transistor and said NMOS transistor; and
performing a plurality of halo ion implant processes form halo implant regions in said substrate for said PMOS transistor and said NMOS transistor;
after forming said extension implant regions and said halo implant regions, removing said continuous liner layer, and thereafter forming an encapsulating layer above said substrate and above said gate structures for both said PMOS transistor and said NMOS transistor;
forming a first spacer adjacent to said encapsulating layer and proximate said gate structures of both said PMOS transistor and said NMOS transistor;
performing a plurality of source/drain ion implant processes with said first spacer in place to form deep source/drain implant regions in said substrate for said PMOS transistor and said NMOS transistor; and
after forming said deep source/drain implant regions, removing first spacer.

15. The method of claim 14, further comprising performing said plurality of said extension ion implant processes and said plurality of halo ion implant processes through said continuous liner layer.

16. The method of claim 14, wherein said plurality of halo ion implant processes is performed prior to performing said plurality of extension ion implant processes for at least one of said PMOS transistor and said NMOS transistor.

17. The method of claim 14, wherein said plurality of halo ion implant processes is performed after performing said plurality of extension ion implant processes for at least one of said PMOS transistor and said NMOS transistor.

18. The method of claim 14, wherein forming each of said continuous liner layer and said first spacer comprises forming a material layer comprising silicon dioxide.

19. The method of claim 18, wherein forming said encapsulating layer comprises forming a material layer comprising silicon nitride.

* * * * *